(12) United States Patent
Takamura

(10) Patent No.: US 7,173,297 B2
(45) Date of Patent: *Feb. 6, 2007

(54) SOLID-STATE IMAGING DEVICE

(75) Inventor: Takashi Takamura, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/790,804

(22) Filed: Mar. 3, 2004

(65) Prior Publication Data

US 2004/0217395 A1 Nov. 4, 2004

(30) Foreign Application Priority Data

Mar. 10, 2003 (JP) .............................. 2003-062820

(51) Int. Cl.
*H01L 21/00* (2006.01)
*H01L 31/062* (2006.01)

(52) U.S. Cl. ...................... 257/291; 257/292; 257/290; 438/48

(58) Field of Classification Search ........ 257/290–293, 257/461–463
See application file for complete search history.

(56) References Cited

U.S. PATENT DOCUMENTS

| 6,051,857 | A | 4/2000 | Miida |
| 6,781,178 | B2* | 8/2004 | Shizukuishi ................ 257/296 |
| 2001/0011736 | A1* | 8/2001 | Dierickx ...................... 257/218 |
| 2002/0036300 | A1* | 3/2002 | Pain et al. ................... 257/184 |
| 2002/0093034 | A1* | 7/2002 | Hynecek ...................... 257/204 |
| 2002/0101532 | A1* | 8/2002 | Takayama et al. .......... 348/362 |
| 2002/0167030 | A1* | 11/2002 | Miida ........................... 257/215 |
| 2003/0090584 | A1* | 5/2003 | Goto ............................ 348/299 |
| 2004/0217351 | A1* | 11/2004 | Takamura ...................... 257/59 |
| 2004/0235261 | A1* | 11/2004 | Konishi et al. ............. 438/400 |
| 2006/0124977 | A1* | 6/2006 | Shinohara et al. .......... 257/292 |

FOREIGN PATENT DOCUMENTS

| JP | A 02-180071 | 7/1990 |
| JP | A 11-195778 | 7/1999 |
| JP | A 2001-298662 | 10/2001 |
| JP | A 2002-016242 | 1/2002 |
| JP | 2002-111960 | * 4/2002 |
| JP | A 2002-353431 | 12/2002 |

* cited by examiner

*Primary Examiner*—Nathan J. Flynn
*Assistant Examiner*—Ahmed N. Sefer
(74) *Attorney, Agent, or Firm*—Oliff & Berridge, PLC

(57) ABSTRACT

The invention provides a solid-state imaging device including a pixel array having a plurality of pixels arranged in a matrix. The pixels can each include a photo diode that generates carriers depending on the intensity of incident light, an accumulation region that accumulates the generated holes, an output transistor that outputs a signal according to threshold voltage that changes depending on the number of carriers accumulated in the accumulation region, and a clear transistor that discharges carriers accumulated in the accumulation region. One of semiconductor regions that form the photo diode and the accumulation region function as a source region of the clear transistor. In the accumulation period, if generated carriers spill from the source region of the clear transistor in the accumulation period, the clear transistor discharges the spilled carriers through a channel of the clear transistor in order to prevent the spilled carriers from entering the accumulation region of adjacent pixels. Accordingly, a technique where carriers in an accumulation region can be easily discharged.

5 Claims, 11 Drawing Sheets

SOLID-STATE IMAGING DEVICE

CROSS-REFERENCE TO RELATED APPLICATION

The disclosure of Japanese Patent Application No.2003-062820 filed Mar. 10, 2003 including the specification, drawings, and claims is incorporated herein by reference in its entirety.

BACKGROUND OF THE INVENTION

1. Field of Invention

The present invention relates to a solid-state imaging device of a threshold voltage modulation system.

2. Description of Related Art

In recent years, mobile electronic equipment, such as cellular phones and digital cameras have been equipped with a small solid-state imaging device. As such a solid-state imaging device, a MOS solid-state imaging device of a threshold voltage modulation system has been developed.

The MOS solid-state imaging device of a threshold voltage modulation system can include a plurality of pixels arranged in a matrix. Each of the pixels includes a single of photo diode and a single of transistor. An accumulation region referred to as a hole pocket, where holes tend to be collected, is formed below a gate electrode of the transistor. The photo diode generates holes depending on the intensity of incident light. The generated holes are accumulated in the accumulation region. The threshold voltage of the transistor changes depending on the number of holes accumulated in the accumulation region. Then, pixel data depending on the intensity of incident light is obtained by reading out the source voltage that changes in response to the change of the threshold voltage. Using a plurality of pixel data corresponding to the plurality of pixels allows one image data to be produced.

Details about the MOS solid-state imaging device of a threshold voltage modulation system are disclosed in, for example, Japanese Unexamined Patent Application Publication No. 11-195778, and the like.

SUMMARY OF THE INVENTION

Meanwhile, in a MOS solid-state imaging device of a threshold voltage modulation system, holes already existing in an accumulation region are discharged (cleared) before an image is picked up, in other words, holes are accumulated in an accumulation region. Holes in an accumulation region were conventionally discharged toward the depth direction of a substrate by applying relatively high voltage to a gate electrode of a transistor. In the conventional method, however, there has been a problem where discharging holes in the accumulation region is relatively difficult.

In view of the above problem of the conventional art, this invention is intended to provide a technique where carriers in an accumulation region can be easily discharged.

In order to solve at least a part of the above-described problem, a device of an embodiment of the present invention is a solid-state imaging device that can include a pixel array having a plurality of pixels arranged in a matrix, and a control unit that controls the pixel array. The pixels each includes a photo diode that generates carriers depending on the intensity of incident light, an accumulation region that accumulates the generated carriers, and an insulated-gate output transistor that outputs a signal according to threshold voltage that changes depending on the number of carriers accumulated in the accumulation region. The pixels each can also include an insulated-gate clear transistor that discharges carriers accumulated in the accumulation region, one of semiconductor regions that form the photo diode and the accumulation region functioning as a source region of the clear transistor. The control unit applies predetermined voltage to a gate electrode of the clear transistor in an accumulation period when the generated carriers are accumulated in the accumulation region. Here, the predetermined voltage is different from voltage applied to the gate electrode of the clear transistor in a discharging period when carries accumulated in the accumulation region are discharged. In the accumulation period, if the generated carriers spill from the source region of the clear transistor, the clear transistor discharges the spilled carriers through the clear transistor in order to prevent the spilled carriers from entering the accumulation region of adjacent pixels.

In this device, each of the pixels has the clear transistor such that holes in the accumulation region can be easily discharged through the clear transistor in the discharging period. Furthermore, in this device, excess carriers spilled from the source region can be discharged through the clear transistor in the accumulation period, such that the deterioration of image quality can be avoided.

In the device, the clear transistor may include a substrate region that is formed below the gate electrode of the clear transistor. The substrate region may include an upper region that is formed in the vicinity of the gate electrode of the clear transistor and that has a relatively low impurity concentration, and a lower region that is formed below the upper region and that has a relatively high impurity concentration. This enables the threshold voltage of the clear transistor to be set relatively low. As a result, discharging of excess carriers in the accumulation period can be realized.

In the device, each of the pixels preferably can include a pixel-forming region of a second conductivity type that is formed on a semiconductor substrate of a first conductivity type and where one of the pixels is formed and a buried region of a first conductivity type that is formed in the pixel-forming region. The buried region includes a first partial buried region formed at a relatively deep position and having a relatively low impurity concentration and a second partial buried region formed at a relatively shallow position and having a relatively high impurity concentration. A junction region between the first partial buried region and the pixel-forming region forms the photo diode. The second partial buried region forms the accumulation region. Each of the pixels also includes a discharging region of a first conductivity type that is formed in the pixel-forming region and into which carriers discharged from the accumulation region flow. The output transistor preferably includes a gate electrode that is formed over the pixel-forming region above the accumulation region through an insulating film. The clear transistor preferably includes a gate electrode that is formed over the pixel-forming region between the buried region and the discharging region.

This can make the structure of the pixels relatively simple. Specifically, the buried region functions as the accumulation region as well as one of semiconductor regions of the photo diode. In addition, the buried region also functions as the source region of the clear transistor.

In the device, the first gate electrode preferably has a substantially annular shape. The output transistor preferably includes a source region that is formed inside the first gate electrode and a drain region that is formed outside the first gate electrode. This can further simplify the structure of the pixels.

In the device, the first conductivity type may be a p-type, and the second conductivity type may be an n-type. The carriers may be holes. This enables each of the pixels to accumulate holes generated in the photo diode in the accumulation region.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Next, embodiments of the present invention will be described.

A. COMPARATIVE EXAMPLE

In order to explain a solid-state imaging device of examples, a solid-state imaging device of a comparative example will be described first.

A-1. STRUCTURE OF SOLID-STATE IMAGING DEVICE OF COMPARATIVE EXAMPLE

Figure 1:
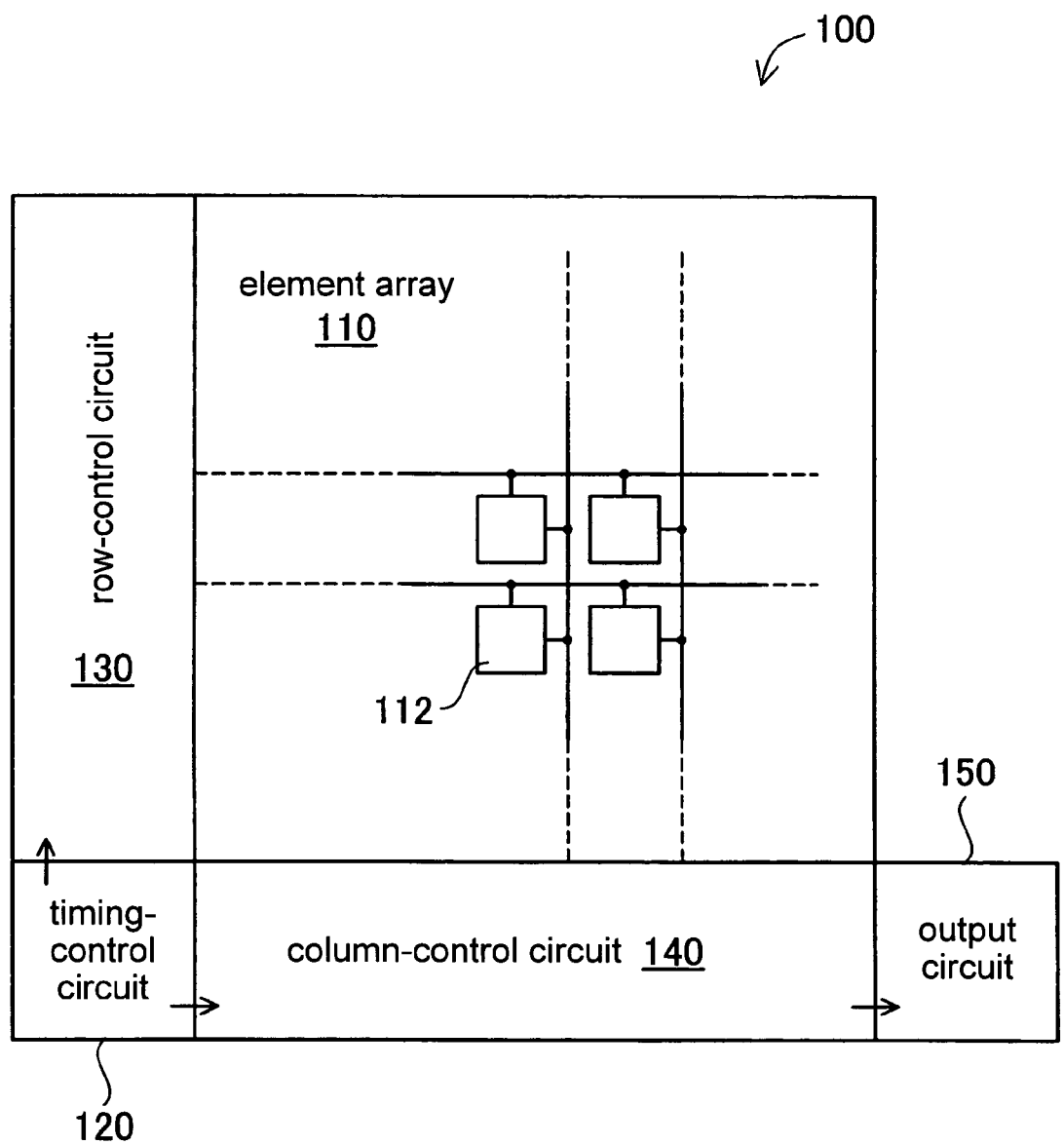
FIG. 1 is an explanatory diagram showing the whole structure of a solid-state imaging device as a comparative example.

FIG. 1 is an explanatory diagram showing the whole structure of a solid-state imaging device as the comparative example. A solid-state imaging device 100 can include a pixel array 110 having a plurality of pixels 112 that are arranged in a matrix, a timing-control circuit 120, a row-control circuit 130, a column-control circuit 140, and an output circuit 150.

The timing-control circuit 120 can provide a timing signal becoming the standard of operation to the row-control circuit 130 and the column-control circuit 140. The row-control circuit 130 can select a single row among a plurality of rows in response to the given timing signal. Meanwhile, the column-control circuit 140 can select a single column among a plurality of columns in response to the given timing signal. This enables any one of pixels to be selected among the plurality of pixels arranged in a matrix, and thereby a signal can be read out from the selected pixel.

Figure 2:
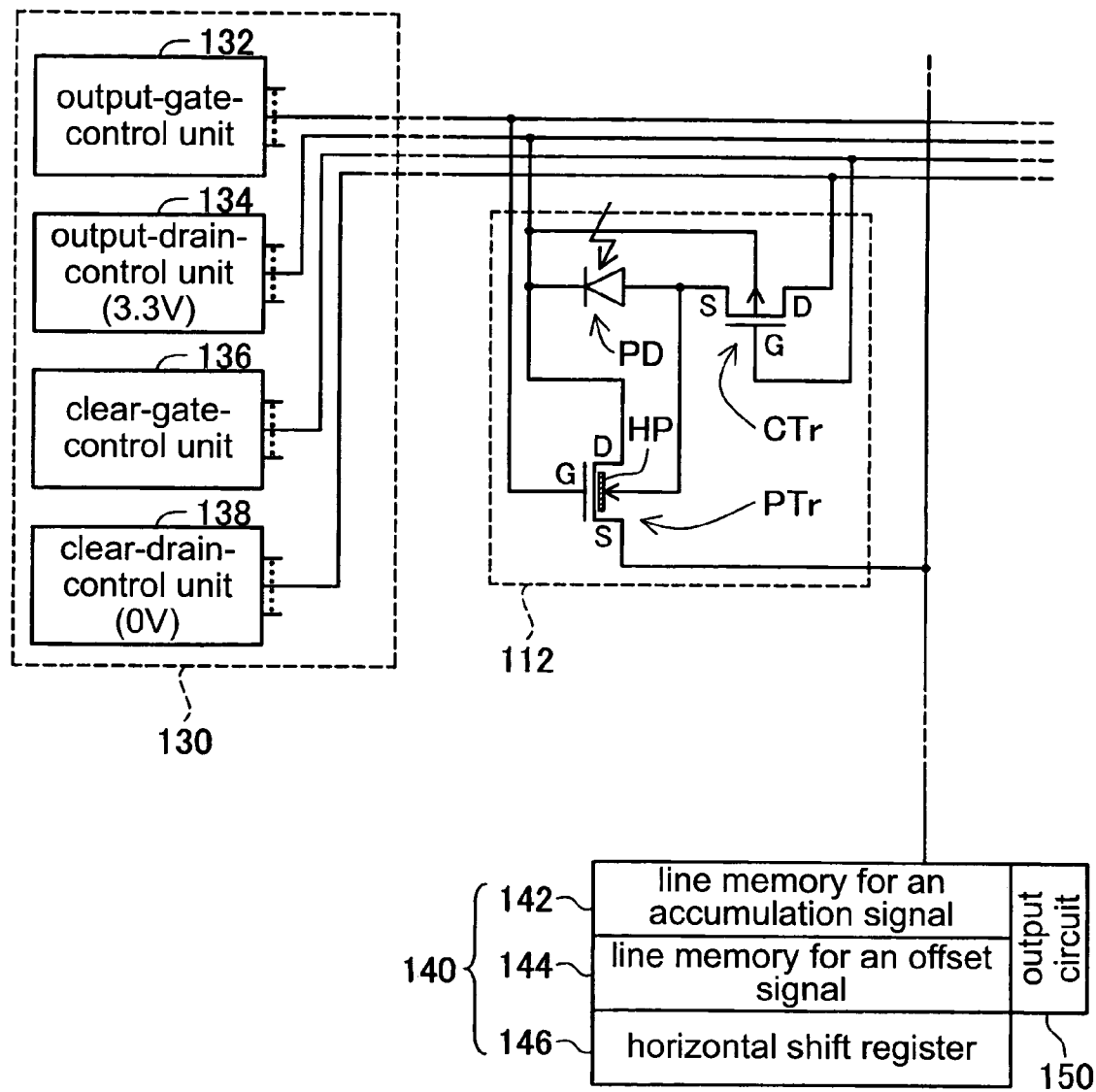
FIG. 2 is an explanatory diagram showing the internal structures of the pixel array 110, the row control circuit 130, and the column control circuit 140, of FIG. 1.

FIG. 2 is an explanatory diagram showing the internal structures of the pixel array 110, the row-control circuit 130, and the column-control circuit 140, of FIG. 1. FIG. 2, however, is represented with focus on only one of the pixels 112.

As shown in the diagram, each of the pixels 112 includes a photo diode PD, an output transistor PTr, and a clear transistor CTr. Furthermore, a hole pocket HP where holes tend to be collected is formed below a gate electrode of the output transistor PTr.

A drain region of the output transistor PTr is electrically coupled to a cathode of the photo diode PD and a substrate region of the clear transistor CTr (namely, a semiconductor region below a gate electrode of the clear transistor). Meanwhile, a source region of the clear transistor CTr is electrically coupled to an anode of the photo diode PD and a substrate region of the output transistor PTr that includes the hole pocket HP (namely, a semiconductor region below a gate electrode of the output transistor).

The gate electrode, the drain region, and a source region of the output transistor PTr will be also referred to as output gate output drain, and output source hereinafter, respectively. In addition, the gate electrode, a drain region, and the source region of the clear transistor CTr will be also referred to as clear gate, clear drain, and clear source hereinafter, respectively.

The photo diode PD generates pairs of electrons and holes by photoelectrically converting incident light. The number of generated pairs of electrons and holes becomes larger as the intensity of incident light becomes stronger. The hole pocket HP accumulates holes generated in the photo diode PD. The threshold voltage of the output transistor PTr changes depending on the number of holes accumulated in the hole pocket HP. As a result, the output transistor PTr can output source voltage depending on the intensity of incident light. Then, the clear transistor CTr discharges holes accumulated in the hole pocket HP. More details about the operation of the pixels will be described later.

The row-control circuit 130 includes an output-gate-control unit 132 for applying voltage to the gate electrode of the output transistor PTr, and an output-drain-control unit 134 for applying voltage to the drain region of the output transistor PTr. Furthermore, the row-control circuit 130 includes a clear-gate-control unit 136 for applying voltage to the gate electrode of the clear transistor CTr, and a clear-drain-control unit 138 for applying voltage to the drain region of the clear transistor CTr. In the comparative example, however, the drain voltage of the output transistor PTr is maintained at about 3.3V, while the drain voltage of the clear transistor CTr is maintained at ground potential (about 0V). The row-control circuit 130 therefore controls only the gate voltage of the output transistor PTr and the gate voltage of the clear transistor CTr in practice.

The column-control circuit 140 includes a line memory 142 for an accumulation signal, a line memory 144 for an offset signal, and a horizontal shift register 146. The column-control circuit 140, at the time of a reading-out state, reads out signal voltage that is obtained reflecting the number of accumulated holes. The output circuit 150 amplifies the signal voltage applied from the column-control circuit 140 so as to output it as pixel data.

Specifically, the column-control circuit 140 reads out two kinds of signal voltages from each of the pixels so as to provide them to the output circuit 150. One of the signal voltages is voltage depending on the intensity of incident light. The other of the signal voltages is voltage depending on the number of holes that remain in the hole pocket after holes accumulated therein were cleared. In the present specification, this voltage, which includes a noise component, is referred to as offset voltage. Then, the output circuit 150 amplifies the difference between these two kinds of signal voltages so as to output it as pixel data.

As is apparent from the above explanation, the circuits 120, 130, and 140 of the comparative example can correspond to the control unit of the present invention.

Figure 3:
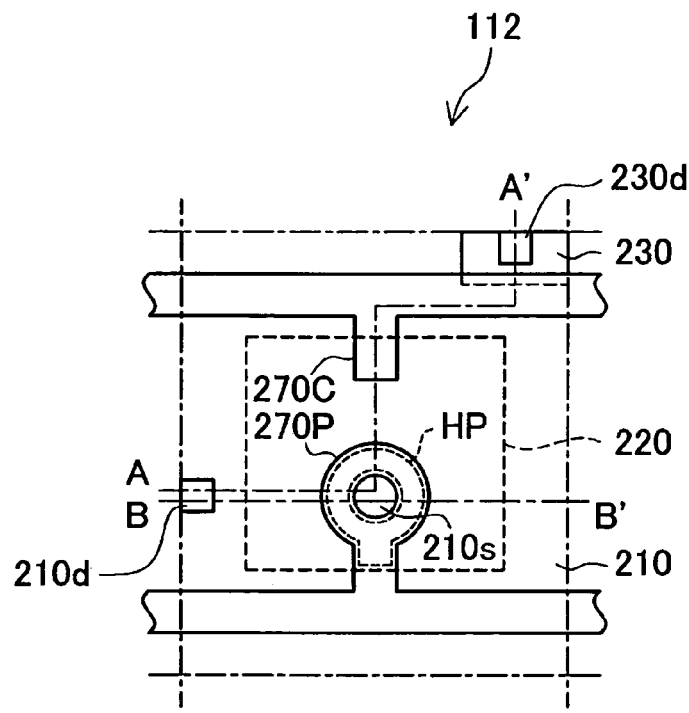
FIG. 3 is an explanatory diagram graphically showing the layout of one of the pixels 112.
Figure 4:
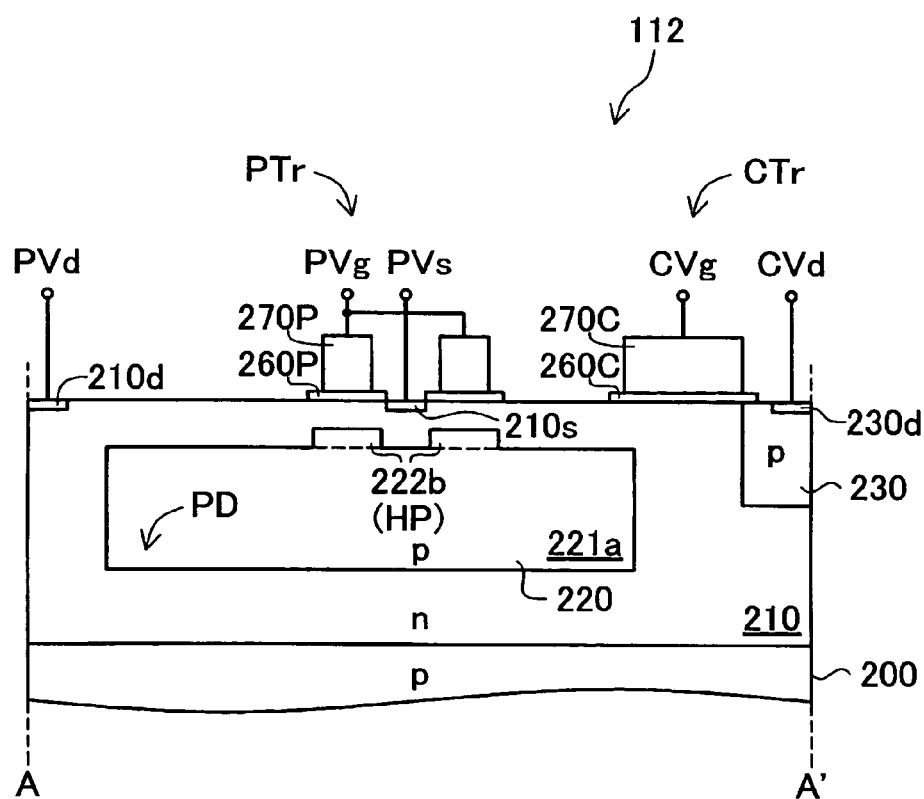
FIG. 4 is an explanatory diagram graphically showing the sectional view of one of the pixels 112.

FIG. 3 is an explanatory diagram graphically showing the layout of one of the pixels 112. FIG. 4 is an explanatory diagram graphically showing a sectional view of one of the pixels 112. Here, FIG. 4 shows a sectional view along the A–A' line of FIG. 3.

The pixels 112 are formed on a semiconductor substrate 200 of a p-type (FIG. 4). An n-region 210 composed of n-type semiconductor is formed on the substrate 200, and a first p-region 220 composed of p-type semiconductor is buried inside the n-region 210. Namely, the first p-region 220 is a floating region, which does not have an electrical contact point directly coupled to the outside. The first p-region 220 includes a first partial p-region 221*a* that is formed at a relatively deep position and that has a relatively low impurity concentration, and a second partial p-region 222*b* that is formed at a relatively shallow position and that has a relatively high impurity concentration. In addition, a second p-region 230 is formed in an end of the n-region 210.

A junction part between the n-region 210 and the first p-region 220 forms the photo diode PD.

The output transistor PTr (FIG. 4) is a depletion type n-channel MOS transistor. The output transistor PTr is formed on a semiconductor substrate whose surface has the n-region 210 provided thereon. In order to suppress the generation of holes causing noise by filling the trap level existing in the surface of the semiconductor substrate with electrons, an n-region is formed on the surface of the semiconductor substrate. A substantially annular output gate 270P is formed over the n-region 210 through a substantially annular gate oxide film 260P. The inside of the substantially annular output gate 270P functions as the source region of the output transistor PTr, while the outside thereof functions as the drain region of the output transistor PTr. Meanwhile, the first p-region 220 formed below the output gate 270P is an electrically floating region surrounded by the n-region, and functions as a region (a substrate region) that applies substrate potential to the output transistor PTr.

In FIGS. 3 and 4, a source contact region 210*s* and a drain contact region 210*d* are shown. These regions are coupled to a metal wiring and have relatively high impurity concentrations. Although FIGS. 3 and 4 show the case where the drain contact region 210*d* is formed in one of the pixels 112, it is formed for the plurality of pixels 112 in common practically.

The hole pocket HP is formed of the second partial p-region (p+-region) 222*b* whose impurity concentration is relatively high. The hole pocket HP has a substantially annular shape and is formed below the substantially annular output gate 270P.

Here, in FIG. 4, the hole pocket HP is represented at a position relatively deep from the surface of the substrate 200 for convenience. Practically, it is formed at a position relatively shallow from the surface of the substrate 200. In addition, although the hole pocket HP is represented so that it has relatively large thickness in the diagram, it practically has relatively small thickness.

The clear transistor CTr (FIG. 4) is an enhancement type p-channel MOS transistor. A clear gate 270C is formed over the n-region 210 through a gate oxide film 260C. The first p-region 220, which includes the hole pocket HP, functions as the source region of the clear transistor CTr. The second p-region 230, which faces the first p-region 220 through the clear gate 270C, functions as the drain region of the clear transistor CTr. Meanwhile, the n-region 210 formed below the clear gate 270C functions as the substrate region of the clear transistor CTr. In FIGS. 3 and 4, a drain contact region 230*d* that is coupled to a metal wiring and whose impurity concentration is relatively high, is shown.

The voltage of the substrate 200 is maintained at ground potential (about 0V). Meanwhile, the drain voltage of the output transistor PTr is maintained at about 3.3V as previously described. In the comparative example, therefore, the n-region 210 functions as a pixel-isolating region that suppresses electrical interference between pixels adjacent to each other.

The first p-region 220 functions as the hole pocket HP as well as the anode of the photo diode PD as previously described. In addition, the first p-region 220 functions as the source region of the clear transistor CTr as well as the substrate region of the output transistor PTr. Such a structure enables the structure of the pixel to be simplified. The pixels 112 may be formed by doping impurity ions into a semiconductor substrate, or may be formed by epitaxial growth.

As is apparent from the above explanation, the n-region 210, the first p-region 220, and the second p-region 230 of the comparative example correspond to the pixel-forming region, the buried region, and the discharging region of the present invention, respectively.

A-2. OPERATION OF SOLID-STATE IMAGING DEVICE OF COMPARATIVE EXAMPLE

Figure 5:
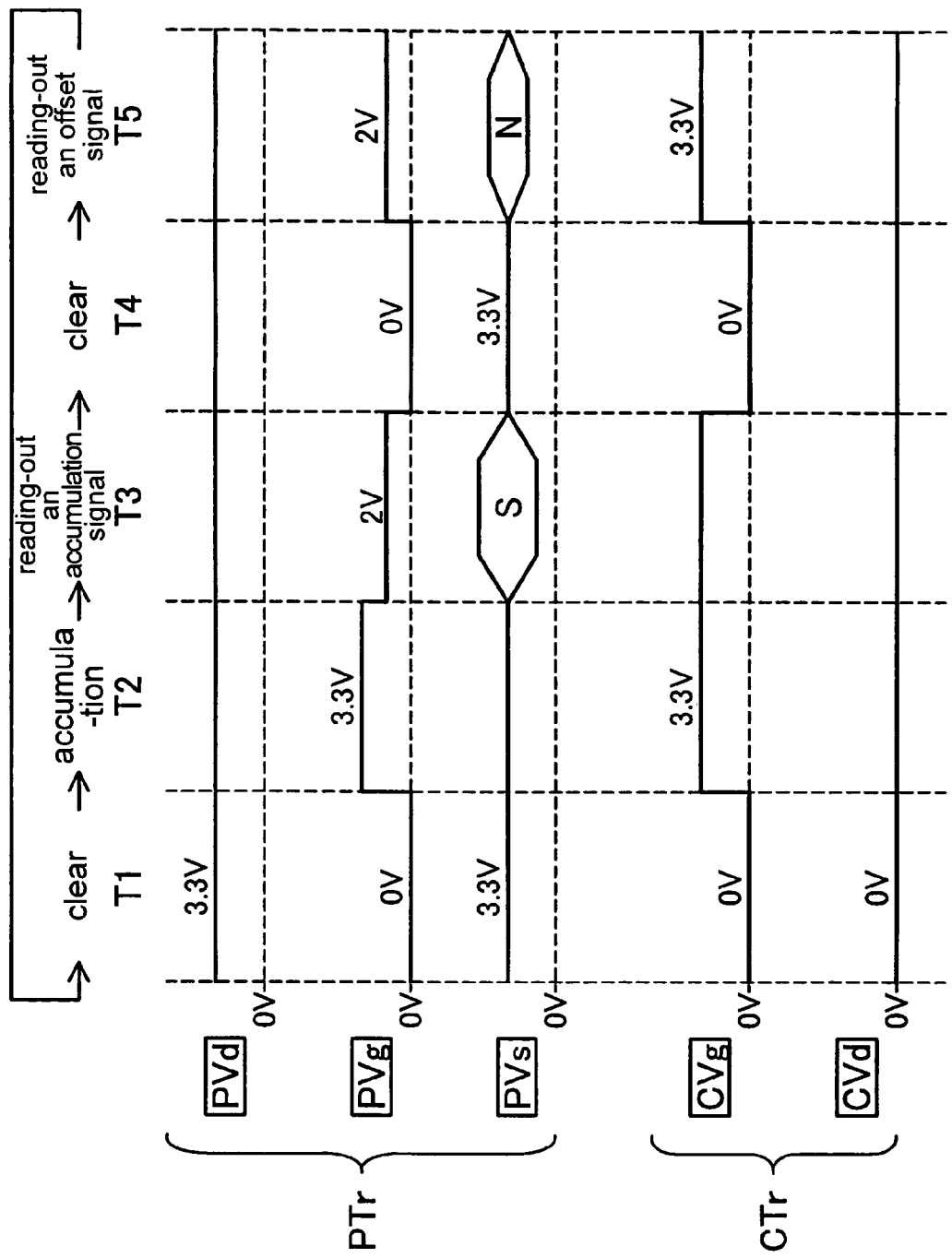
FIG. 5 is an explanatory diagram showing the operational sequence of the pixels 112.

FIG. 5 is an explanatory diagram showing the operational sequence of the pixels 112. As shown in the diagram, one time of the operational sequence is completed through a first clear period T1, an accumulation period T2, a reading-out period T3 for an accumulation signal, a second clear period T4, and a reading-out period T5 for an offset signal. Two clear periods T1 and T4 are periods for discharging holes from the hole pocket HP. The accumulation period T2 is a period for accumulating holes in the hole pocket HP. Two reading-out periods T3 and T5 are periods for reading out a signal depending on the number of holes existing in the hole pocket HP.

IN THE COMPARATIVE EXAMPLE, DRAIN VOLTAGE PVD OF THE OUTPUT TRANSISTER PTR is consistently maintained at about 3.3V, while drain voltage CVd of the clear transistor CTr is consistently maintained at about 0V as previously described. The way of controlling the transistors PTr and CTr during the clear period T1 is the same as that during the clear period T4, and the way of controlling the transistors T3 and T5 during the reading-out period T3 is the same as that during the reading-out period T5.

Figure 6:
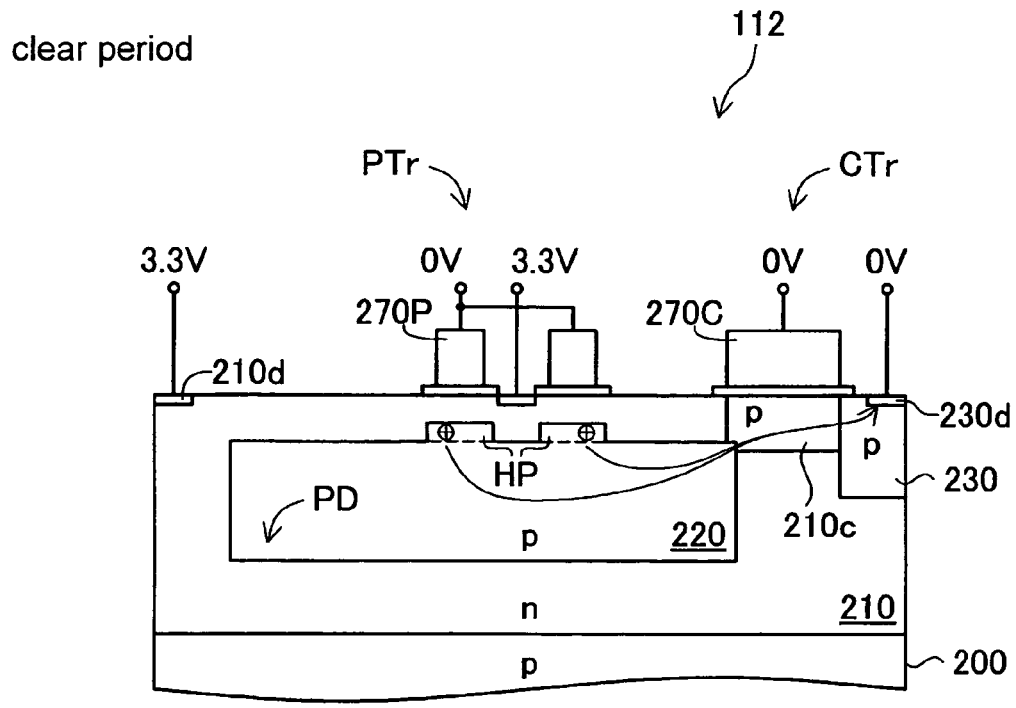
FIG. 6 is an explanatory diagram showing the internal state of one of the pixels 112 during a first clear period T1.

A-2-1. Clear Period:

FIG. 6 is an explanatory diagram showing the internal state of one of the pixels 112 during the first clear period T1. In the first clear period T1, gate voltage PVg and source voltage PVs of the output transistor PTr are set to be about 0V and about 3.3V, respectively, as shown in FIG. 5. At this time, the output transistor PTr is set to be in an "off" state. Meanwhile, gate voltage CVg of the clear transistor CTr is set to be about 0V. At this time, the clear transistor CTr is set to be in an "on" state. This is because the substrate voltage of the clear transistor CTr (namely, the voltage of the n-region 210 below the clear gate 270C) is almost equal to the drain voltage PVd (about 3.3V) of the output transistor PTr.

In the clear period T1, a channel region 210c is formed below the clear gate 270C. Holes existing in the hole pocket HP therefore pass through the first p-region 220, the channel region 210c, and the second p-region 230 so as to be discharged from the drain contact region 230d.

The operation during the fourth clear period T4 (FIG. 5) is the same as that during the first clear period T1. The first clear period T1, however, is set in order to discharge holes that may remain in the hole pocket HP slightly preceding the accumulation period T2, while the second clear period T4 is set in order to discharge holes that are accumulated in the hole pocket HP during the accumulation period T2.

Figure 7:
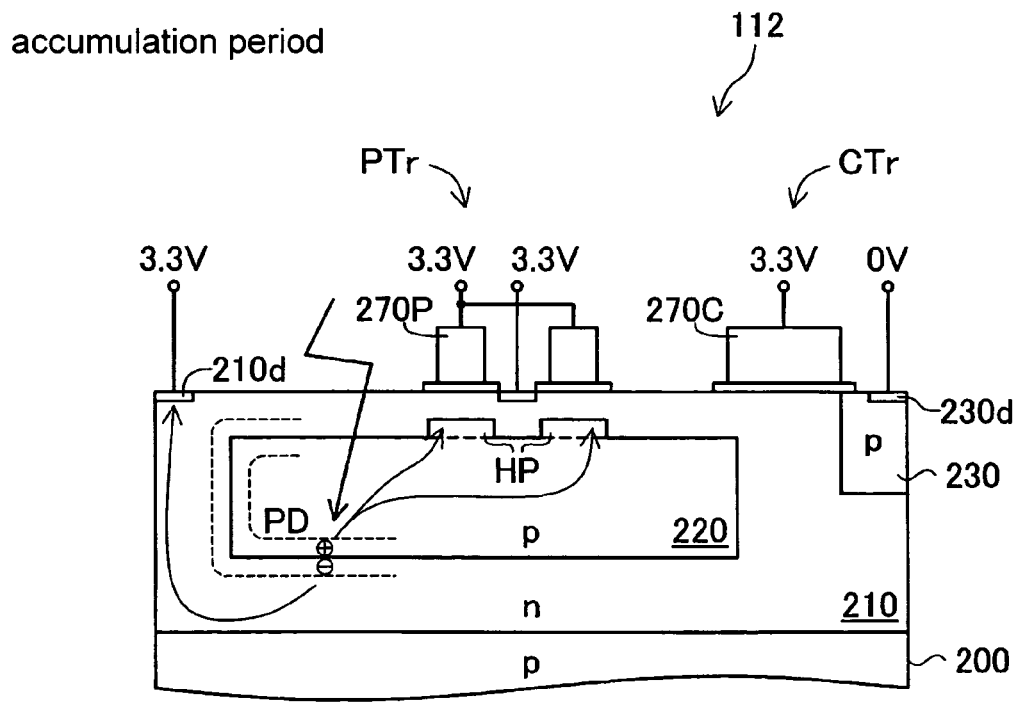
FIG. 7 is an explanatory diagram showing the internal state of one of the pixels 112 during an accumulation period T2.

A-2-2. Accumulation Period:

FIG. 7 is an explanatory diagram showing the internal state of one of the pixels 112 during the accumulation period T2. In the accumulation period T2, the gate voltage PVg of the output transistor PTr is changed as shown in FIG. 5. Specifically, the gate voltage PVg is set to be about 3.3V. At this time, the output transistor PTr is set to be in an "on" state. In addition, the gate voltage CVg of the clear transistor CTr is also changed. Specifically, the gate voltage CVg is set to be about 3.3V. At this time, the clear transistor CTr is set to be in an "off" state.

If the output transistor PTr is set to be in an "on" state as described above, an electronic layer can be induced in the interface of the gate insulating film. As a result, the generation of dark currents attributed to interface defects can be suppressed.

In the accumulation period T2, a depletion region (for example, a region sandwiched between two dashed lines of FIG. 7) is formed in the vicinity of the junction interface between the n-region 210 and the p-region 220 that form the photo diode PD. When light enters the photo diode PD, pairs of electrons and holes are generated by photoelectrical conversion. Electrons pass through the n-region 210 so as to be discharged from the drain contact region 210d. Meanwhile, holes are collected in the hole pocket HP in the p-region 220 so as to be accumulated. This is because the hole pocket HP has a relatively high impurity concentration such that it has relatively low potential against holes.

Figure 8:
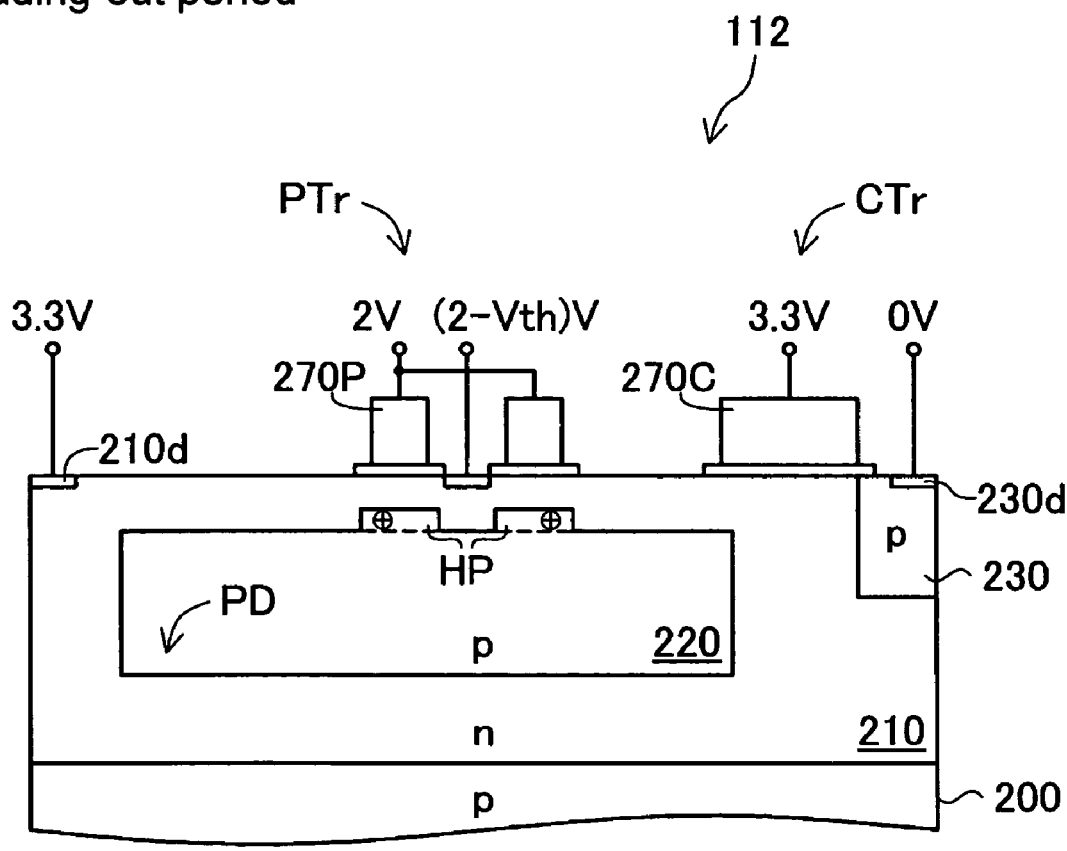
FIG. 8 is an explanatory diagram showing the internal state of one of the pixels 112 during a reading-out period T3 for an accumulation signal.

A-2-3. Reading-Out Period:

FIG. 8 is an explanatory diagram showing the internal state of one of the pixels 112 during the reading-out period T3 for an accumulation signal. In the reading-out period T3 for an accumulation signal, the gate voltage PVg of the output transistor PTr is changed as shown in FIG. 5. Specifically, the gate voltage PVg is set to be about 2V, which is lower than the drain voltage PVd (about 3.3V). In addition, the output transistor PTr operates as a source follower in the reading-out period T3 for an accumulation signal.

Then, accumulation voltage (an accumulation signal) depending on the number of holes accumulated in the hole pocket HP is read out from the source region of the output transistor PTr.

In the reading-out period T3 for an accumulation signal, holes are maintained at a state of being accumulated in the hole pocket HP. The source voltage PVs of the output transistor PTr is represented by a formula PVs=PVg−Vth, where Vth is the threshold voltage of the output transistor PTr. The threshold voltage Vth changes depending on the number of holes accumulated in the hole pocket HP. Specifically, the larger the number of accumulated holes is, the lower the threshold voltage Vth becomes. Meanwhile, the lower the threshold voltage Vth is, the higher the source voltage PVs becomes. Namely, the larger the number of holes accumulated in the hole pocket HP is, in other words, the higher the intensity of light entering the photo diode PD is, the higher the source voltage PVs becomes.

The operation during the reading-out period T5 for an offset signal (FIG. 5) is the same as that during the reading-out period T3 for an accumulation signal. In the reading-out period T5 for an offset signal, however, offset voltage (an offset signal) of a state where holes scarcely exist in the hole pocket HP is output from the source region of the output transistor PTr. The output circuit 150 (FIG. 1) amplifies difference between read-out two signals (namely, an accumulation signal and an offset signal) so as to output pixel data from which a noise component is removed.

Here, although the second clear period T4 and the reading-out period T5 for an offset signal are included in one time of the operational sequence in the comparative example as shown in FIG. 5, these two periods T4 and T5 may be omitted. In this case, the output circuit 150 (FIG. 1) may obtain pixel data from difference between a read-out accumulation signal and a predetermined offset signal that is previously prepared. Otherwise, the output circuit 150 may obtain pixel data from only a read-out accumulation signal.

As described above, the solid-state imaging device 100 of the comparative example can include the pixel array 110 having the plurality of pixels 112 arranged in a matrix. In addition, each of the pixels can include the photo diode PD for generating holes according to the intensity of incident light, and the hole pocket HP for accumulating the generated holes. Each of the pixels also includes the output transistor PTr for outputting a signal according to the threshold voltage that changes depending on the number of holes accumulated in the hole pocket, and the clear transistor CTr for discharging holes accumulated in the hole pocket. Thus, in the solid-state imaging device 100 of the comparative example, each of the pixels 112 has the clear transistor CTr such that holes in the hole pocket can be easily discharged through the channel region 210c of the clear transistor CTr.

Each of the pixels heretofore does not have the clear transistor as previously described. For this reason, holes heretofore were discharged toward the depth direction of the substrate 200 by applying relatively high voltage (for example, from about 5V to about 7V) to the gate electrode of the output transistor PTr. Namely, the row-control circuit 130 (FIG. 1) heretofore was required to generate relatively high voltage.

On the other hand, in the comparative example, holes can be discharged through the channel region 210c formed in the vicinity of the surface of the substrate 200 by only controlling the clear transistor with relatively low voltage, since each of the pixels includes the clear transistor CTr. Holes in the hole pocket HP therefore can be easily discharged.

A-3. OPERATION OF THE COMPARATIVE EXAMPLE

Meanwhile, in the comparative example, if light with strong intensity enters a part of the pixels of the pixel array in the accumulation period T2 (FIG. 5), a phenomenon where the distribution of entering light of the pixel array mismatches the distribution of the pixel data output from the pixel array, may be caused.

Figure 9A:
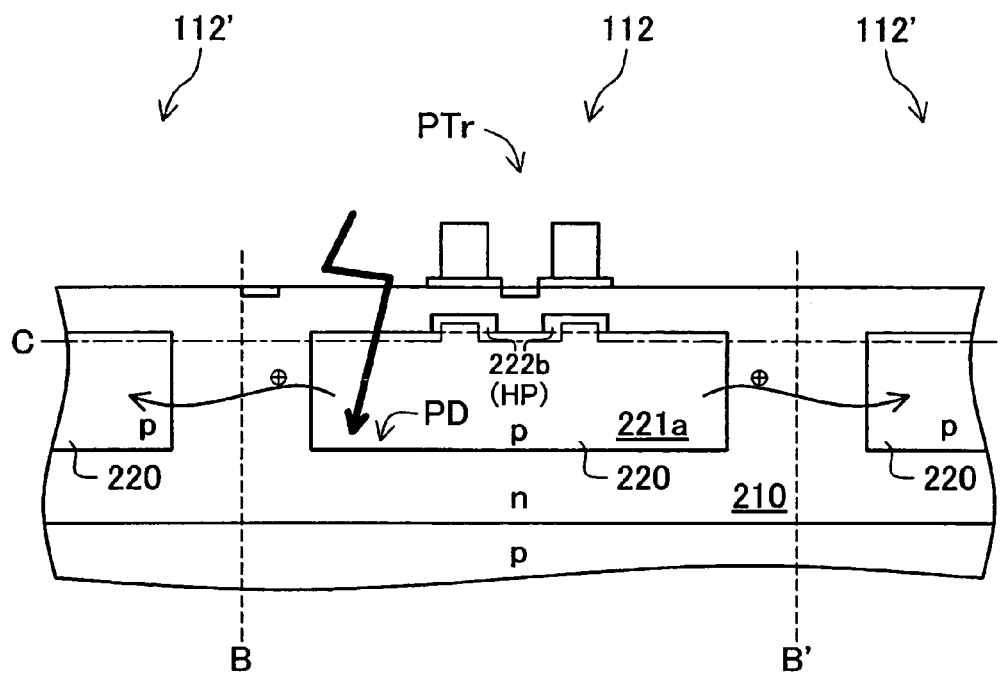
FIG. 9 is an explanatory diagram showing the internal state of one of the pixels 112 at the time of receiving light with strong intensity during the accumulation period T2.
Figure 9B:
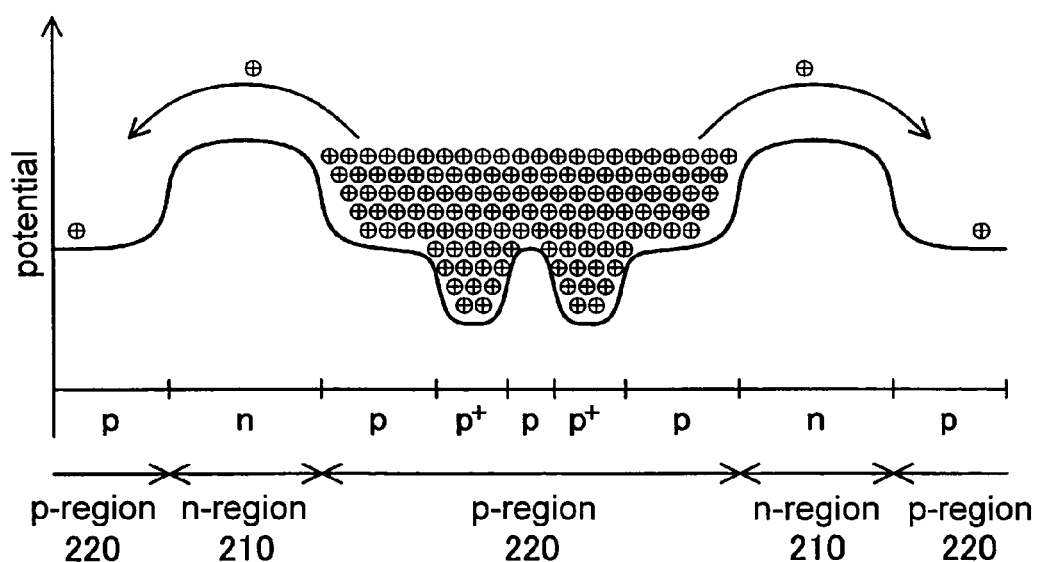

FIG. 9 is an explanatory diagram showing the internal state of one of the pixels 112 at the time of receiving light with strong intensity during the accumulation period T2. FIG. 9(A) shows a sectional view along the B–B' line of FIG. 3. In FIG. 9(A), however, one of the pixels 112 where light enters (pixels of interest), and adjacent pixels 112' that are arranged in the same row as that of the pixels of interest, are shown. FIG. 9(B) shows the potential distribution along the C line of FIG. 9(A). The curved line of FIG. 9(B), however, shows the potential distribution at a state where holes are not accumulated. As is apparent from the curved line, the potential of the first p-region 220 is lower than that of the n-region 210 surrounding it. In addition, in the first p-region 220, the potential of the second partial p-region (p+-region) 222b, which forms the hole pocket HP, is lower than that of the first partial p-region 221a.

When light enters the pixels 112 of interest, the photo diode PD generates holes. The generated holes are accumulated in the hole pocket HP. However, if the intensity of light entering the pixels 112 of interest is relatively strong, holes spill from the hole pocket HP so as to be placed in the first p-region 220, which includes the hole pocket HP. Moreover, if the intensity of light entering the pixels 112 of interest is further stronger, namely, if the number of generated holes exceeds the capacity of the first p-region 220, the excess holes spill from the first p-region 220.

The holes spilled from the first p-region 220 enter the first p-region 220 of the adjacent pixels 112' over the barrier of the n-region 210. At this time, in the adjacent pixels 112', holes are accumulated in the hole pocket even though light does not enter them. Then, accumulation signals depending on the number of holes accumulated in the hole pocket are read out from the adjacent pixels 112'. Although FIG. 9 shows the case where excess holes enter the adjacent holes 112' that are arranged in the same row as that of the pixels 112 of interest, excess holes may also enter the adjacent holes 112' that are arranged in the same column as that of the pixels 112 of interest similarly. As a result, in a produced image, not only a region corresponding to the pixels of interest shows white, a region surrounding it also shows white such that the image quality is deteriorated. This phenomenon is referred to as blooming.

Examples described below employ features for avoiding the deterioration of image quality. Specifically, the generation of the blooming phenomenon is avoided by utilizing the clear transistor CTr, which is provided to each of the pixels.

B. EXAMPLES

Figure 10:
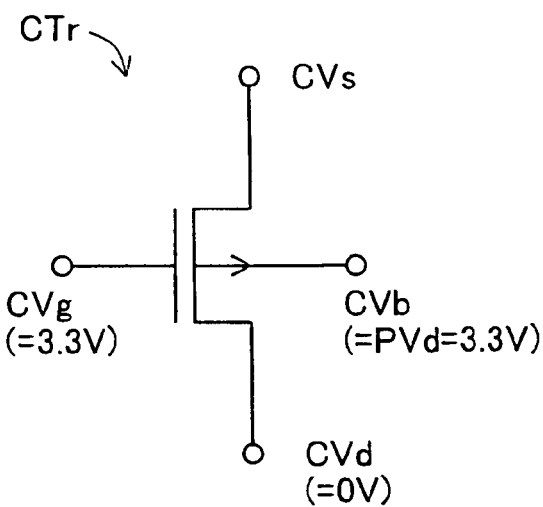
FIG. 10 is an explanatory diagram showing voltages applied to four terminals of the clear transistor CTr.

FIG. 10 is an explanatory diagram showing voltages applied to four terminals of the clear transistor CTr. As previously described, the gate voltage CVg is set to be about 3.3V during the accumulation period T2 (FIG. 5) in the comparative example. The substrate voltage CVb (namely, the voltage of the n-region 210 that functions as a substrate region of the clear transistor) is set to be about 3.3V, which is almost equal to the drain voltage PVd of the output transistor. The drain voltage CVd is set to be about 0V. Meanwhile, the source voltage CVs is equal to the voltage of the first p-region 220 and depends on the number of holes generated in the photo diode PD.

The clear transistor CTr is set to be in an "on" state when the condition CVs>CVg+CVth is satisfied, while being set to be an "off" state when the condition is not satisfied. Here, CVth is the threshold voltage (absolute value) of the clear transistor CTr.

In the comparative example, the clear transistor CTr is kept at an "off" state even when holes generated in the photo diode PD spill from the first p-region 220, in the accumulation period. On the other hand, in examples described below, the clear transistor CTr is set to be in an "on" state if generated holes spill from the first p-region 220. Namely, an adjustment is given to the pixels so that the clear transistor CTr is changed from an "off" state to an "on" state with the source voltage CVs at the time when generated holes spill from the first p-region 220. This enables the clear transistor CTr to discharge holes spilled from the first p-region 220. As a result, the generation of the blooming phenomenon can be avoided.

B-1. FIRST EXAMPLE

In a first example, the control of the pixels is the same as that of the comparative example (FIG. 5), while only the pixel structure is different therefrom.

Figure 11:
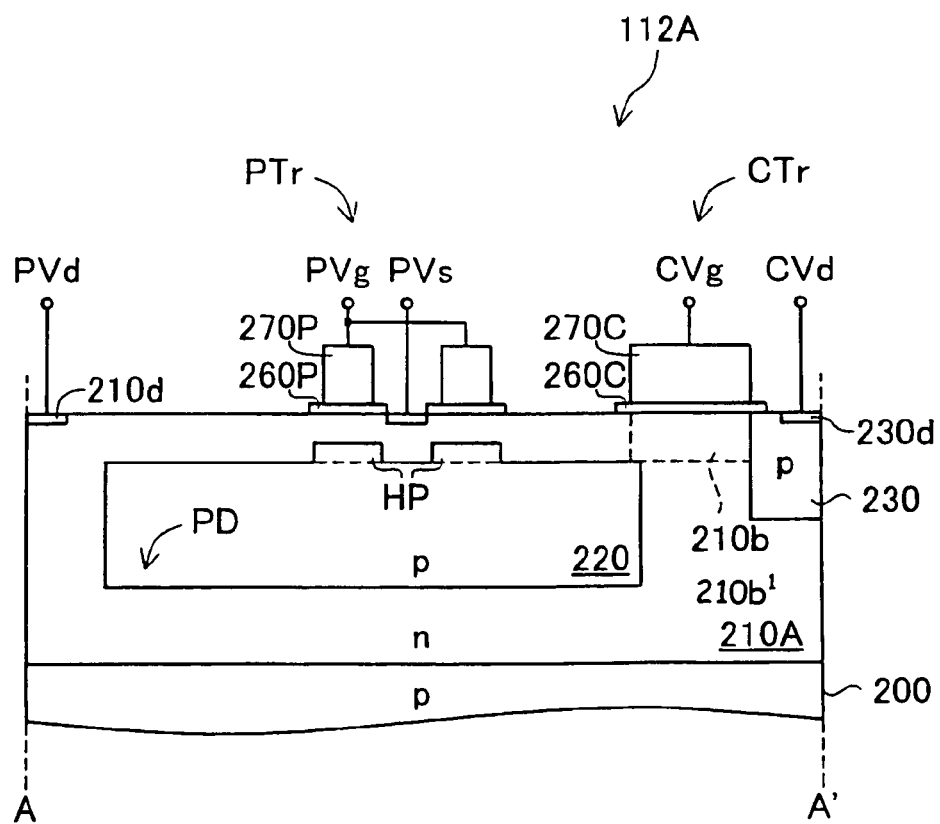
FIG. 11 is an explanatory diagram showing the pixel structure of the first example and corresponds to FIG. 4.

FIG. 11 is an explanatory diagram showing the pixel structure of the first example and corresponds to FIG. 4. FIG. 11 is almost same as FIG. 4. In pixels 112A, however, an n-region 210A that functions as the substrate region of the clear transistor CTr is different from the n-region 210 of the pixels 112. Specifically, the n-region 210A formed below the clear gate 270C includes an interface region 210b having a relatively low impurity concentration in the vicinity of the interface between the gate insulating film 260C and the n-region 210A. In other words, the substrate region 210A of the clear transistor CTr includes an upper region (interface region 210b) formed in the vicinity of the clear gate 270C and having a relatively low impurity concentration, and a lower region $210b^1$ formed below the upper region and having a relatively high impurity concentration. In this structure, the clear transistor CTr is set to be in an "on" state with the source voltage CVs at the time when generated holes spill from the first p-region 220, since the threshold voltage CVth of the clear transistor is set to be relatively low.

Figure 12A:
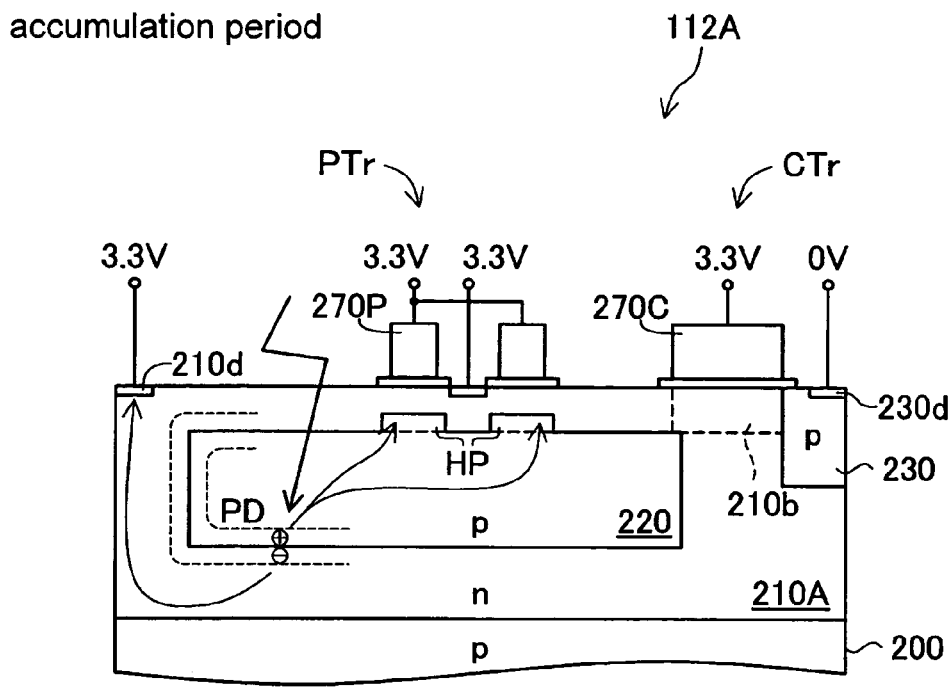
FIG. 12 is an explanatory diagram showing the internal state of one of the pixels 112A during the accumulation period T2.
Figure 12B:
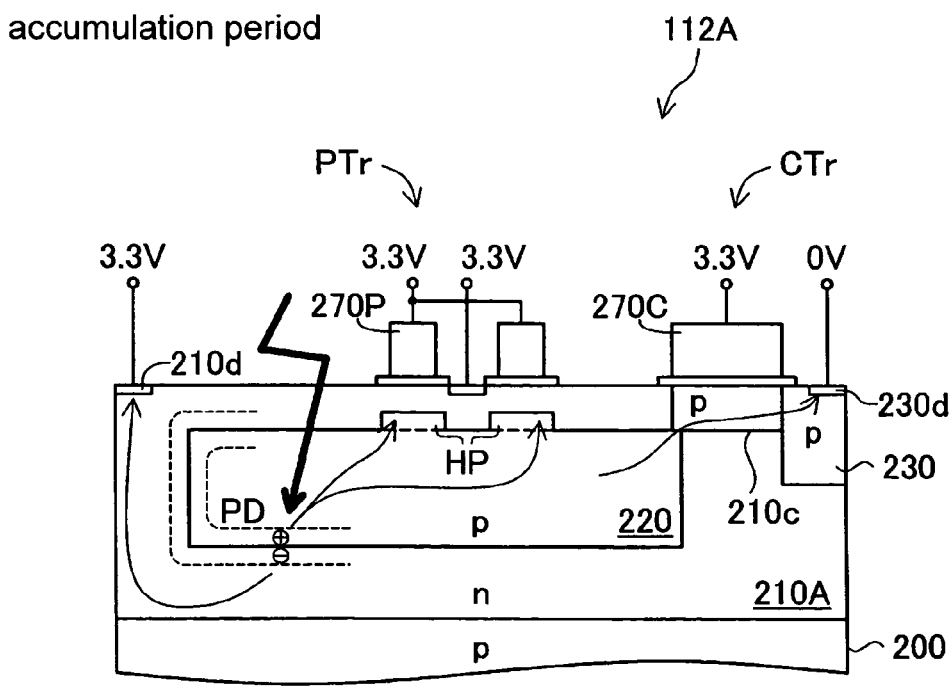

FIG. 12 is an explanatory diagram showing the internal state of one of the pixels 112A during the accumulation period T2. FIG. 12(A) and (B) show the internal states of the pixels, at the case where the intensity of entering light is at a usual level, and at the case where it is at a high level, respectively.

When the intensity of entering light is at a usual level (FIG. 12(A)), holes generated in the photo diode PD are accumulated in only the hole pocket HP. At this time, the voltage of the first p-region 220, namely, the source voltage CVs of the clear transistor is, for example, from about 2V to about 3V such that the clear transistor CTr is set to be in an "off" state.

Meanwhile, when the intensity of entering light is at a high level (FIG. 12 (B)), holes generated in the photo diode PD spill from the first p-region 220 including the hole pocket HP. At this time, the voltage of the first p-region 220, namely, the source voltage CVs of the clear transistor is, for example, about 5V such that the clear transistor CTr is set to be in an "on" state. More specifically, when the source voltage CVs is relatively high, the channel region 210c is formed in the n-region 210 below the clear gate 270C. The excess holes spilled from the first p-region 220 pass through the channel region 210c and the second p-region 230 so as to be discharged from the drain contact region 230d. The channel region 210c is formed in the interface region 210b, which has a relatively low impurity concentration.

As described above, the threshold voltage CVth of the clear transistor is set to be relatively low in the first example. Thus, even when the row-control circuit 130 (FIG. 1) applies predetermined voltage (in the present example, about 3.3V) to the clear gate 270C, the transition of the clear transistor CTr from an "off" state to an "on" state in accordance with the source voltage CVs is realized. Specifically, if the source voltage is relatively low (namely, generated holes do not spill from the source region 220), the clear transistor CTr is set to be in an "off" state. Meanwhile, if the source voltage is relatively high (namely, generated holes spill from the source region 220), the clear transistor CTr is set to be in an "on" state. The clear transistor CTr, therefore, can discharge excess holes through the channel region 210c if holes spill from the source region 220 of the clear transistor. As a result, spilled excess holes can be prevented from entering the hole pocket of the adjacent pixels such that the deterioration of image quality (the generation of a blooming phenomenon) can be avoided.

Here, the predetermined voltage applied to the clear gate 270c in the accumulation period T2 (in the present example, about 3.3V) is different from the voltage applied to the clear gate 270C in the clear periods T1 and T4 (in the present example, about 0V). Namely, the gate voltage CVg is set to voltage where the channel region 210c is invariably formed, during the clear periods T1 and T4, while the gate voltage CVg is set to voltage where the channel region 210c is formed depending on the state of the source region (source voltage), during the accumulation period T2.

B-2. SECOND EXAMPLE

In a second example, the pixel structure is the same as that of the comparative example (FIG. 4), while only the control of the pixels are different therefrom.

Figure 13:
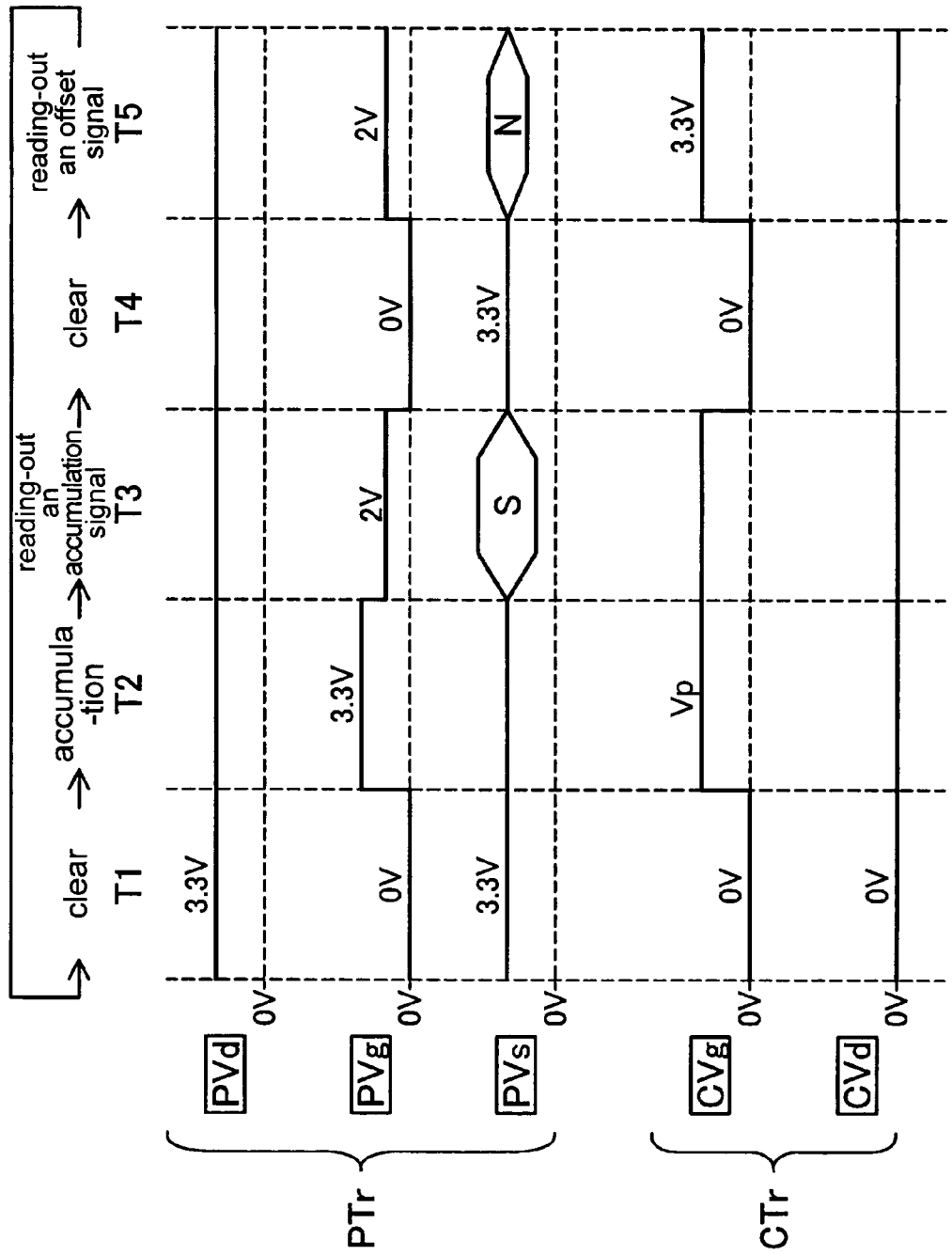
FIG. 13 is an explanatory diagram showing the operational sequence of the pixels 112 in the second example and corresponds to FIG. 5.

FIG. 13 is an explanatory diagram showing the operational sequence of the pixels 112 in the second example and corresponds to FIG. 5. Although FIG. 13 is almost same as FIG. 5, the gate voltage CVg of the clear transistor CTr during the accumulation period T2 is changed. Specifically, the gate voltage CVg is changed to predetermined voltage Vp which is lower than about 3.3V in the comparative example (for example, about 2.5V). If the gate voltage CVg is set to the voltage Vp, which is relatively low, the clear transistor CTr is set to be in an "on" state with the source voltage CVs at the time when generated holes spill from the first p-region 220.

Figure 14A:
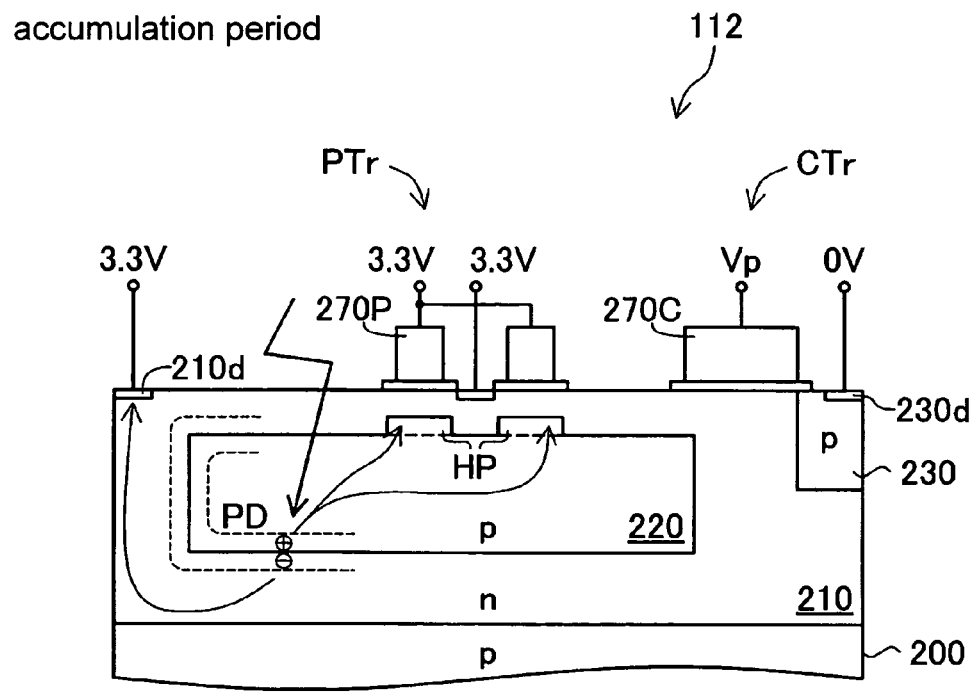
FIG. 14 is an explanatory diagram showing the internal state of one of the pixels 112 during the accumulation period T2.
Figure 14B:
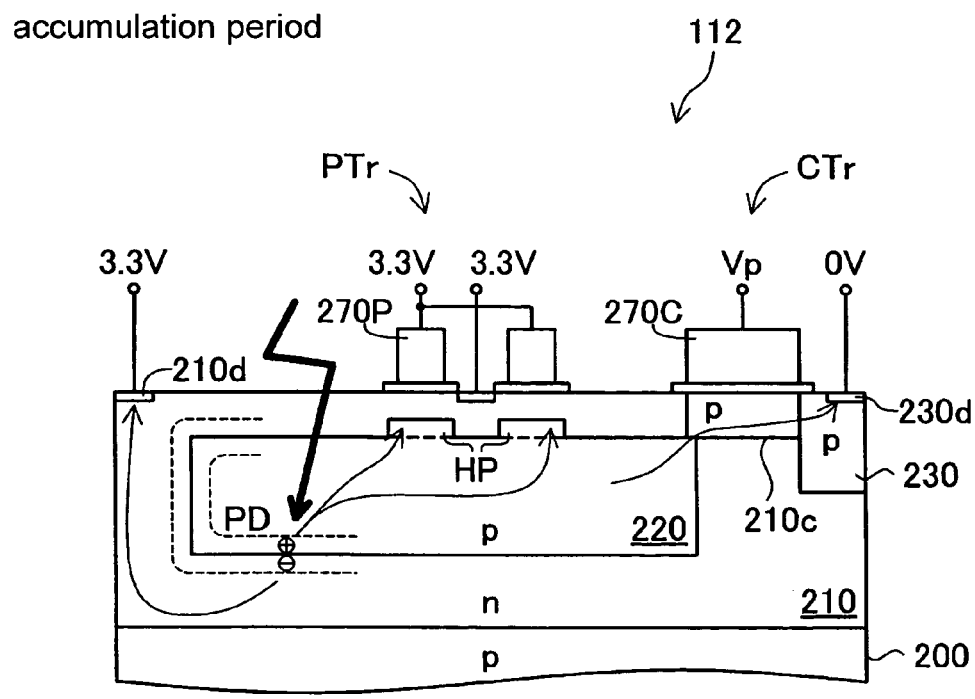

FIG. 14 is an explanatory diagram showing the internal state of one of the pixels 112 during the accumulation period T2. Here, FIGS. 14(A) and (B) correspond to FIGS. 12(A) and (B), respectively. When the intensity of incident light is at a usual level (FIG. 14(A)), as with FIG. 12(A), the clear transistor CTr is set to be in an "off" state. Meanwhile, when the intensity of incident light is at a high level (FIG. 14(B)), as with FIG. 12(B), the clear transistor CTr is set to be in an "on" state. In the first example, however, the channel region 210c is formed since the impurity concentration of the interface region 210b is set to be relatively low, while, in the second example, the channel region 210c is formed since the gate voltage CVg applied to the clear gate 270C is set to be relatively low.

As described above, the gate voltage CVg of the clear transistor is set to the predetermined voltage Vp, which is relatively low, in the second example. Thus, even when the row-control circuit 130 (FIG. 1) applies predetermined voltage (in the present example, about 2.5V) to the clear gate 270C, the transition of the clear transistor CTr from an "off" state to an "on" state in accordance with the source voltage CVs is realized. Specifically, the clear transistor CTr is set to be in an "off" state when the source voltage is relatively low, while being set to be in an "on" state when it is relatively high. The clear transistor CTr, therefore, can discharge excess holes through the channel region 210c if holes spill from the source region 220 of the clear transistor. As a result, spilled excess holes can be prevented from entering the hole pocket of the adjacent pixels such that the deterioration of image quality (the generation of a blooming phenomenon) can be avoided.

Here, as with the first example, the predetermined voltage applied to the clear gate 270c in the accumulation period T2 (in the present example, about 2.5V) is different from the voltage applied to the clear gate 270C in the clear periods T1 and T4 (in the present example, about 0V).

It should be understood that the present invention is not limited to the above-described examples and embodiments, but can beapplied to various kinds of modifications without departing from the scope and spirit of the present invention. For example, the following modifications are available.

Although the output transistor PTr has the substantially annular gate electrode 270P in the above-described examples, instead of this, it may have a substantially rectangular gate electrode. In the examples, however, there is an advantage that the structure of pixels can be simplified. In addition, the substantially annular gate electrode has a substantially circular outer periphery and a substantially circular inner periphery in the examples, instead of this, it may have a substantially circular outer periphery and a substantially circular inner periphery. Otherwise, it may have a substantially polygonal outer periphery and a substantially circular inner periphery. Namely, substantially annular has only to be a closed shape.

In the first example, the threshold voltage CVth is set to be relatively low, and thereby the switching of the clear transistor CTr between an "off" state and an "on" state in accordance with the source voltage CVs is realized in the accumulation period.

In the second example, the gate voltage CVg is set to be relatively low, and thereby the switching of the clear transistor CTr between an "off" state and an "on" state in accordance with the source voltage CVs is realized in the accumulation period.

Generally, if generated carriers spill from the source region of the clear transistor in the accumulation period, it is sufficient that the clear transistor discharge the spilled carriers through the clear transistor in order to prevent the spilled carriers from entering the accumulation region of the adjacent pixels.

In addition, although the threshold voltage CVth is adjusted by the impurity concentration of the interface region 210b in the first example, instead of this, it may be adjusted by the capacitance of the gate insulating film 260C.

Although holes are accumulated in the accumulation region in the examples, instead of this, electrons may be accumulated. In this case, a p-type semiconductor region and an n-type semiconductor region may be replaced with each other.

What is claimed is:

1. A solid-state imaging device, comprising:

a pixel array having a plurality of pixels arranged in a matrix; and a control unit that controls the pixel array;

each of the pixels including:

a photo diode that generates carriers depending on an intensity of incident light;

an accumulation region that accumulates the generated carriers;

an insulated-gate output transistor that outputs a signal according to a threshold voltage that changes depending on a number of the carriers accumulated in the accumulation region; and an insulated-gate clear transistor that discharges the carriers accumulated in the accumulation region;

the control unit applies a predetermined voltage to a gate electrode of the clear transistor in an accumulation period when the generated carriers are accumulated in the accumulation region, the predetermined voltage being different from voltage applied to the gate electrode of the clear transistor in a discharging period when the carries accumulated in the accumulation region are discharged, the accumulation period being a time period in which carriers are accumulated in the accumulation region up to the capacity of the accumulation region; and the clear transistor discharges spilled carriers in order to prevent the spilled carriers from entering the accumulation region of adjacent pixels, if the generated carriers spill from a source region of the clear transistor, in the accumulation period, each of the pixels further comprising:

a pixel-forming region of a second conductivity type that is formed on a semiconductor substrate of a first conductivity type and where at least one of the pixels is formed;

a buried region of a first conductivity type that is formed in the pixel-forming region and that includes a first partial buried region and a second partial buried region, the first partial buried region formed at a relatively deep position and having a relatively low impurity concentration, the second partial buried region formed at a relatively shallow position and having a relatively high impurity concentration, the second partial buried region being the accumulation region; and a discharging region of a first conductivity type that is formed in the pixel-forming region and into which carriers discharged from the accumulation region flow;

the output transistor including an output gate electrode and being formed above the pixel-forming region on the accumulation region with an insulating film therebetween; and the clear transistor including a clear gate electrode and being formed above the pixel-forming region between the buried region that includes the first and second partial buried regions and the discharging region.

2. The solid-state imaging device according to claim 1, the photo diode including a junction region between the first partial buried region and the pixel-forming region.

3. The solid-state imaging device according to claim 1, both the accumulation region and the buried region that includes the first and second partial buried regions functioning as a source region of the clear transistor.

4. The solid-state imaging device according to claim 1:

the output gate electrode having a substantially annular shape; and the output transistor including a source region that is formed inside the gate electrode and a drain region that is formed outside the output gate electrode.

5. The solid-state imaging device according to claim 1:

the first conductivity type being a p-type;

the second conductivity type being an n-type; and the carriers being holes.

* * * * *